US012009565B2

(12) United States Patent
Tesson et al.

(10) Patent No.: US 12,009,565 B2
(45) Date of Patent: Jun. 11, 2024

(54) POWER COMBINER/SPLITTER FOR MILLIMETRE WAVE APPLICATIONS

(71) Applicant: NXP B.V., Eindhoven (NL)

(72) Inventors: Olivier Tesson, Bretteville l'Orgueilleuse (FR); Mustafa Acar, Eindhoven (NL)

(73) Assignee: NXP B.V., Eindhoven (NL)

( * ) Notice: Subject to any disclaimer, the term of this patent is extended or adjusted under 35 U.S.C. 154(b) by 545 days.

(21) Appl. No.: 17/314,219

(22) Filed: May 7, 2021

(65) Prior Publication Data
US 2021/0359388 A1 Nov. 18, 2021

(30) Foreign Application Priority Data
May 14, 2020 (EP) ..................................... 20305497

(51) Int. Cl.
 *H03H 7/46* (2006.01)
 *H01L 23/66* (2006.01)
 (Continued)

(52) U.S. Cl.
 CPC ................ *H01P 5/16* (2013.01); *H01L 23/66* (2013.01); *H01P 11/003* (2013.01); *H03H 7/461* (2013.01); *H01L 2223/6627* (2013.01)

(58) Field of Classification Search
 CPC .......... H01P 1/213; H01P 1/2135; H01P 5/12; H01P 5/16; H03H 7/46; H03H 7/461;
 (Continued)

(56) References Cited

U.S. PATENT DOCUMENTS 5,662,816 A * 9/1997 Andry ..................... H01P 3/081
 428/209
2018/0375220 A1* 12/2018 Mei ........................ H01Q 21/08

FOREIGN PATENT DOCUMENTS

CN 108183301 A 6/2018
CN 108767408 A 11/2018
(Continued)

OTHER PUBLICATIONS

Nafe et al.; 2x64 Dual-Polarized Dual-Beam Single-Aperture 28 GHz Phased Array with High Cross-Polarization rejection for 5G Polarization MIMO; Jun. 2019; 2019 IEEE/MTT-S international Microwave Symposium, pp. 484-487 (Year: 2019).*
(Continued)

Primary Examiner — Stephen E. Jones

(57) ABSTRACT

A power combiner/splitter for multiple input multiple output (MIMO) applications and a method of making the same. A metallisation stack has a plurality of layers including patterned metal features forming first and second branched arrangements of the power combiner/splitter. Each branched arrangement includes a port located at one end of that branched arrangement, and a plurality of further ports. Each branched arrangement also includes a plurality of bifurcated branches extending between each end of that branched arrangement for dividing/combining a signal passing through that branched arrangement between the port and the plurality of further ports. The metallisation stack further includes a common ground plane that is shared by the first and second branched arrangements. At least some of the patterned metal features forming the first branched arrangement overlie at least some of the patterned metal features forming the second branched arrangement.

14 Claims, 8 Drawing Sheets

(51) Int. Cl.
*H01P 5/16* (2006.01)
*H01P 11/00* (2006.01)

(58) Field of Classification Search
CPC .......... H03H 7/468; H03H 7/48; H03H 7/482; H03H 7/487; H01L 2223/6627; H01L 23/66
See application file for complete search history.

(56) References Cited

FOREIGN PATENT DOCUMENTS

| | | | |
|---|---|---|---|
| JP | 2000124711 | A | 4/2000 |
| KR | 100863392 | B1 | 10/2008 |

OTHER PUBLICATIONS

Ercoli, M., "Small Size High Isolation Wilkinson Power Splitter for 60 GHz Wireless Sensor Network Applications, IEEE 11th Topical Meeting on Silicon Monolithic Integrated Circuits in RF Systems", Jan. 17-19, 2011.
Kim, D., "A High performance Transformer-Type Wilkinson Power Splitter with Compensating Circuit for CATV Transmission System and Optimal Design Method", IEEE Transactions of Consumer Electronics, vol. 50, Issue 3, Oct. 8, 2004.
Sun, Y., "Broadband folded Wilkinson power combiner/splitter", IEEE Microwave and Wireless Components Letters, vol. 14, Issue 6, Jun. 7, 2004.
Tourche, K., "Design and realization of a two way microstrip Wilkinson power splitter, 2017 Seminar on Detection Systems Architectures and Technologies", Feb. 20-22, 2017.
Wang, H.L. (G.), "A Passive RF Component Technology; Materials, Techniques and Application", pp. 262-272 (missing p. 271), ISBN: 9781608072002, copyright 2011.

* cited by examiner

POWER COMBINER/SPLITTER FOR MILLIMETRE WAVE APPLICATIONS

CROSS-REFERENCE TO RELATED APPLICATIONS

This application claims the priority under 35 U.S.C. § 119 of European Patent application no. 20305497.8, filed on 14 May 2020, the contents of which are incorporated by reference herein.

BACKGROUND

The present specification relates to a power combiner/splitter of the kind that may be used in millimetre wave (mm-Wave) applications requiring Multiple-Input and Multiple-Output (MIMO) operation.

The Wilkinson combiner/splitter a popular device for mmWave design. Although the implementation of a Wilkinson combiner/splitter can be generally straightforward, it can typically consume a lot of area on the substrate. Despite this, with the increasing demand for mm-Wave integrated circuits (ICs), this type of device can be integrated on silicon and/or laminate types of structure.

For analog beamforming (phased-array operation), there is strong requirement to provide a dual polarization patch antenna allowing MIMO operation. As a consequence, two Wilkinson combiners have to be integrated.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a power combiner/splitter for multiple input multiple output (MIMO) applications, the power combiner/splitter comprising:
  a metallisation stack formed on a surface, the metallisation stack comprising a plurality of layers including patterned metal features, the patterned metal features forming:
    a first branched arrangement comprising:
      a first port located at one end of the first branched arrangement;
      a plurality of further ports located;
      a plurality of bifurcated branches extending between the first port of the first branched arrangement and the plurality of further ports of the first branched arrangement for dividing/combining a signal passing through the first branched arrangement between the first port and the plurality of further ports of the first branched arrangement; and
    a second branched arrangement comprising:
      a first port located at one end of the second branched arrangement;
      a plurality of further ports;
      a plurality of bifurcated branches extending between the first port of the second branched arrangement and the plurality of further ports of the first branched arrangement for dividing/combining a signal passing through the second branched arrangement between the first port and the plurality of further ports of the second branched arrangement;
    wherein the metallisation stack further comprises a common ground plane shared by the first and second branched arrangements, and
    wherein the first branched arrangement and the second branched arrangement are located in a common area of the metallisation stack such that at least some of the patterned metal features forming the first branched arrangement overlie at least some of the patterned metal features forming the second branched arrangement.

According to another aspect of the present disclosure, there is provided a method of making a power combiner/splitter for multiple input multiple output (MIMO) applications, the method comprising:
  forming a metallisation stack formed on a surface, the metallisation stack comprising a plurality of layers including patterned metal features, the patterned metal features forming:
    a first branched arrangement comprising:
      a first port located at one end of the first branched arrangement;
      a plurality of further ports located;
      a plurality of bifurcated branches extending between the first port of the first branched arrangement and the plurality of further ports of the first branched arrangement for dividing/combining a signal passing through the first branched arrangement between the first port and the plurality of further ports of the first branched arrangement; and
    a second branched arrangement comprising:
      a first port located at one end of the second branched arrangement;
      a plurality of further ports;
      a plurality of bifurcated branches extending between the first port of the second branched arrangement and the plurality of further ports of the first branched arrangement for dividing/combining a signal passing through the second branched arrangement between the first port and the plurality of further ports of the second branched arrangement;
    wherein the first branched arrangement and the second branched arrangement are located in a common area of the metallisation stack such that at least some of the patterned metal features forming the first branched arrangement overlie at least some of the patterned metal features forming the second branched arrangement; and
  forming a common ground plane in a layer of the metallisation stack, wherein the common ground plane is shared by the first and second branched arrangements.

The provision of the features of a combiner/splitter in a metallisation stack allows for improved manufacturing including convenient scaling of the device (e.g. choice of number of inputs/outputs for MIMO applications) and further allows the combiner/splitter to be integrated e.g. on a die of a semiconductor die using back end of line (BEOL) processing techniques. The metallisation stack implementation allows for the provision and selective placement of a common ground plane layer for optimised isolation between the first and second branched arrangements.

In some embodiments, the first port of the first branched arrangement is an input and the plurality of further ports of the first branched arrangement are outputs. In some other embodiments, the first port of the first branched arrangement is an output and the plurality of further ports of the first branched arrangement are inputs.

In some embodiments, the first port of the second branched arrangement is an input and the plurality of further ports of the second branched arrangement are outputs. In some other embodiments, the first port of the second branched arrangement is an output and the plurality of further ports of the second branched arrangement are inputs.

Accordingly, the power combiner/splitter can act as a power combiner or a power splitter according to the configuration of the ports as inputs/outputs.

In some embodiments, the first port of the first branched arrangement and the first port of the second branched arrangement are located at the same end of the power combiner/splitter. In some other embodiments, the first port of the first branched arrangement and the first port of the second branched arrangement are located at opposite ends of the power combiner/splitter.

In some other embodiments, the patterned metal features forming at least some of the branches of the first branched arrangement are formed in a same layer of the metallisation stack as the patterned metal features forming at least some of the branches of the second branched arrangement.

In some other embodiments, the patterned metal features forming the first branched arrangement are located in a plurality of layers of the metallisation stack. In some other embodiments, the patterned metal features forming the second branched arrangement are located in a plurality of layers of the metallisation stack. In some other embodiments, the metallisation stack includes two layers each including patterned metal features forming at least some of the branches of the first branched arrangement and patterned metal features forming at least some of the branches of the second branched arrangement.

In some other embodiments, a first of the two layers includes:
  patterned metal features forming branches of the first branched arrangement proximal the first port of the first branched arrangement; and
  patterned metal features forming branches of the second branched arrangement proximal said plurality of further ports of the second branched arrangement; and
a second of the two layers includes:
  patterned metal features forming branches of the first branched arrangement proximal said plurality of further ports of the first branched arrangement; and
  patterned metal features forming branches of the second branched arrangement proximal the first port of the second branched arrangement.

In some other embodiments, the ground plane is located in a layer located in-between said two layers. This can improve the isolation between the first and second branched arrangements.

In some other embodiments, all of the patterned metal features forming the first branched arrangement are located in a first layer of the metallisation stack and all of the patterned metal features forming the second branched arrangement are located in a second layer of the metallisation stack. The ground plane can be located in a layer of the metallisation stack located in-between the first layer and the second layer. This can improve the isolation between the first and second branched arrangements.

According to a further aspect of the present disclosure, there is provided an integrated circuit comprising the power combiner/splitter of any of claims 1 to 12, wherein the metallisation stack is formed on a surface of a semiconductor die of the integrated circuit.

According to another aspect of the present disclosure, there is provided a carrier for a semiconductor device, the carrier comprising the power combiner/splitter of any of claims 1 to 12, wherein the metallisation stack is formed on a surface of the carrier.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
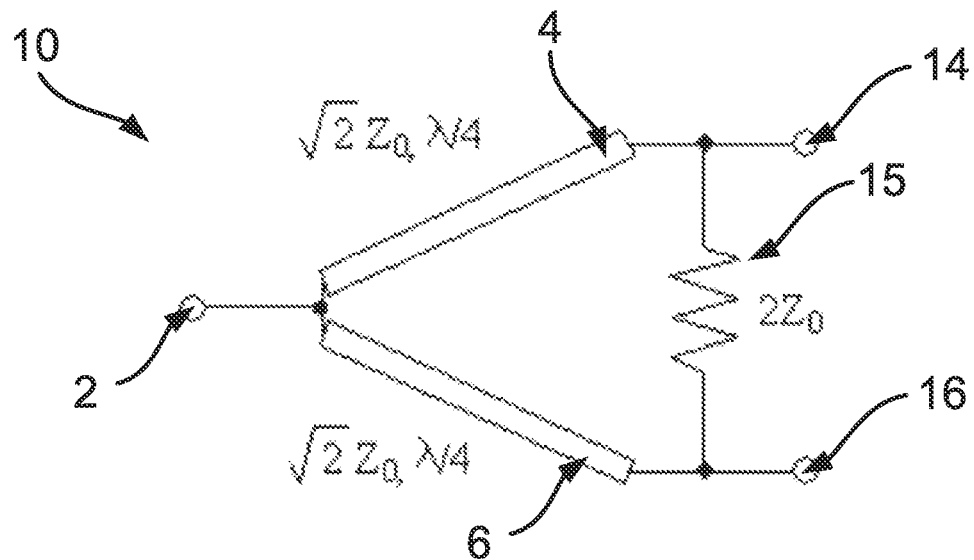
FIG. 1 schematically illustrates a Wilkinson combiner/splitter.

FIG. 1 schematically illustrates an example of a Wilkinson combiner/splitter 10. The combiner/splitter 10 has a first port 2, a second port 14 and a third port 16. When operating as a splitter, the first port 2 may act as an input port and the ports 14, 16 may act as output ports. Conversely, when operating as a combiner, the first port 2 may act as an output port and the ports 14, 16 may act as input ports. The combiner/splitter 10 has two $\lambda/4$ lines 4, 6 having a characteristic impedance $\mathrm{sqrt}(2)*Z_0$ coupled with a resistor with a value of $2*Z_0$ between them for isolation purposes. When, for example, the combiner/splitter 10 acts as a splitter, a signal input at port 2 is split into two equivalent paths along the lines 4, 6, with insertion losses of around −3 dB.

Figure 2:
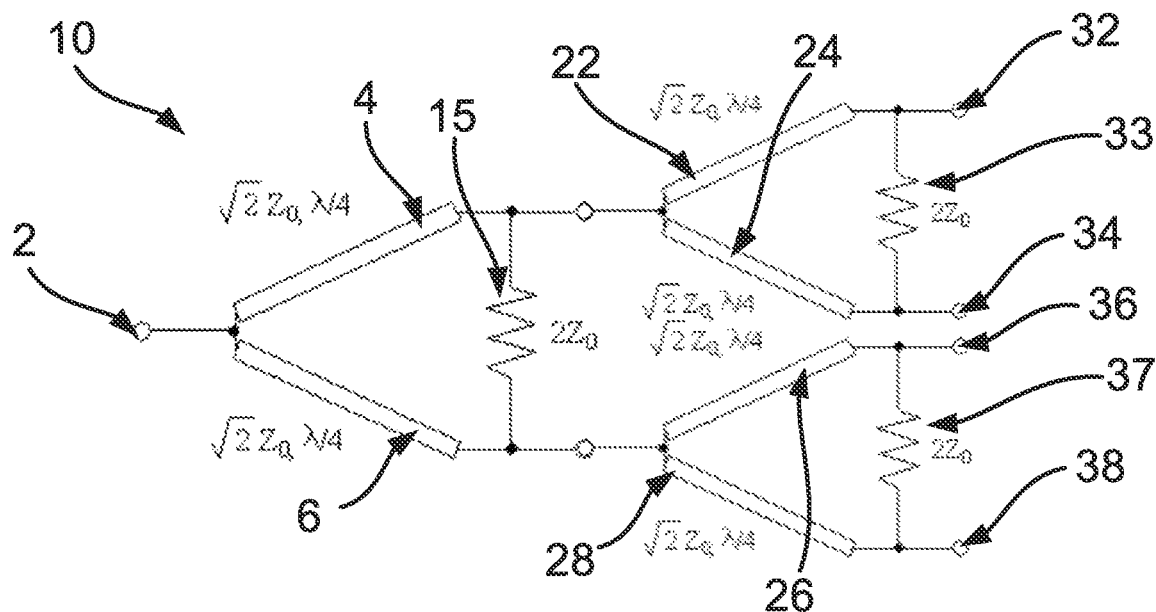
FIG. 2 schematically illustrates a cascaded Wilkinson combiner/splitter.

Although the Wilkinson combiner/splitter 10 shown in FIG. 1 has two ports 14, 16 for acting as inputs/outputs, the combiner/splitter 10 may be expanded (in a cascaded configuration) to have more ports of this kind. Thus, FIG. 2 schematically illustrates another example of a Wilkinson combiner/splitter 10. In the example of FIG. 2, the combiner/splitter 10 has ports 2, 32, 34, 36, 38. When operating as a splitter, the first port 2 may act as an input port and the ports 32, 34, 36, 38 may act as output ports. Conversely, when operating as a combiner, the first port 2 may act as an output port and the ports 32, 34, 36, 38 may act as input ports. Note that the combiner/splitter 10 shown in FIG. 2 may be considered to comprise a combiner/splitter 10 of the kind shown in FIG. 1, with two further such combiner/splitters 10 coupled to the ports 14, 16 in FIG. 1. When, for example, the combiner/splitter 10 acts as a splitter, a signal input at port 2 is split into four equivalent paths along the lines 22, 24, 26, 28 with splitting losses (insertion losses will be given by the metallic/dielectric losses and may be added to splitting losses). Note that a "loss-less" splitter leads to losses of 6 dB. Further cascading of the Wilkinson combiner/splitter 10 shown in FIG. 1 may allow for even more combiner inputs or splitter outputs to be provided.

Wilkinson combiner/splitters may occupy a relatively large area, which may be problematic when. For instance, more than one such combiner/splitter is provided on a substrate such as a semiconductor substrate or other carrier, where space may be at a premium. In accordance with embodiments of this disclosure, a plurality of combiner/splitters may be provided in a metallisation stack (e.g. on a surface of semiconductor substrate or carrier) in an stacked arrangement in which features of each combiner/splitters overlay each other.

Figure 3:
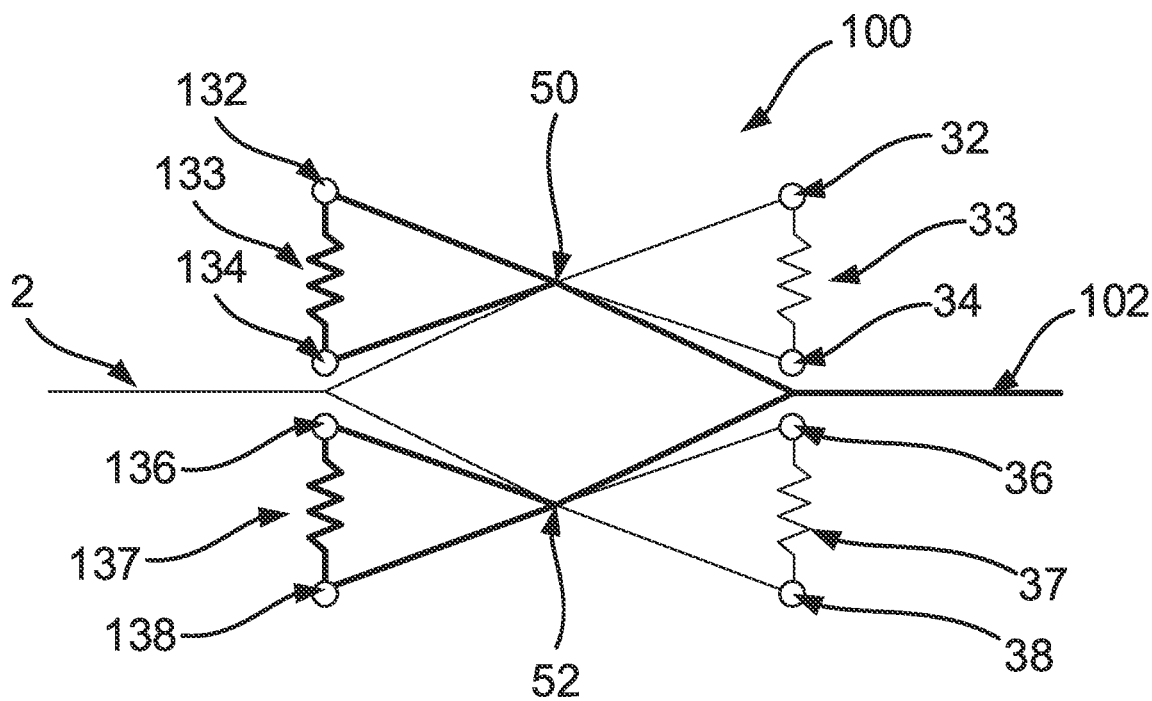
FIG. 3 schematically illustrates a power combiner/splitter according to an embodiment of this disclosure.

FIG. 3 schematically illustrates a power combiner/splitter 100 according to an embodiment of this disclosure. In this embodiment, a first combiner/splitter has ports 2, 32, 34, 36, 38 similar to those described above in relation to FIG. 2. In this embodiment, a second combiner/splitter has ports 102, 132, 134, 136, 138 also similar to those described above in relation to FIG. 2. Embodiments of this disclosure may facilitate multiple input multiple output (MIMO) applications by providing multiple such ports.

The impedances between the ports 32, 34, 36, 38 is denoted in FIG. 3 by the impedances 33, 37, while the impedances between the ports 132, 134, 136, 138 is denoted in FIG. 3 by the impendences 133, 137. As can be seen, in FIG. 3, the first combiner/splitter overlays the second combiner/splitter, and the first combiner/splitter has an opposite orientation to the second combiner/splitter, such that the port 2 of the first combiner/splitter is provided on the same side of the power combiner/splitter 100 as the ports 132, 134, 136, 138 of the second combiner/splitter and the port 102 of the second combiner/splitter is provided on the same side of the power combiner/splitter 100 as the ports 32, 34, 36, 38 of the first combiner/splitter.

Figure 4:
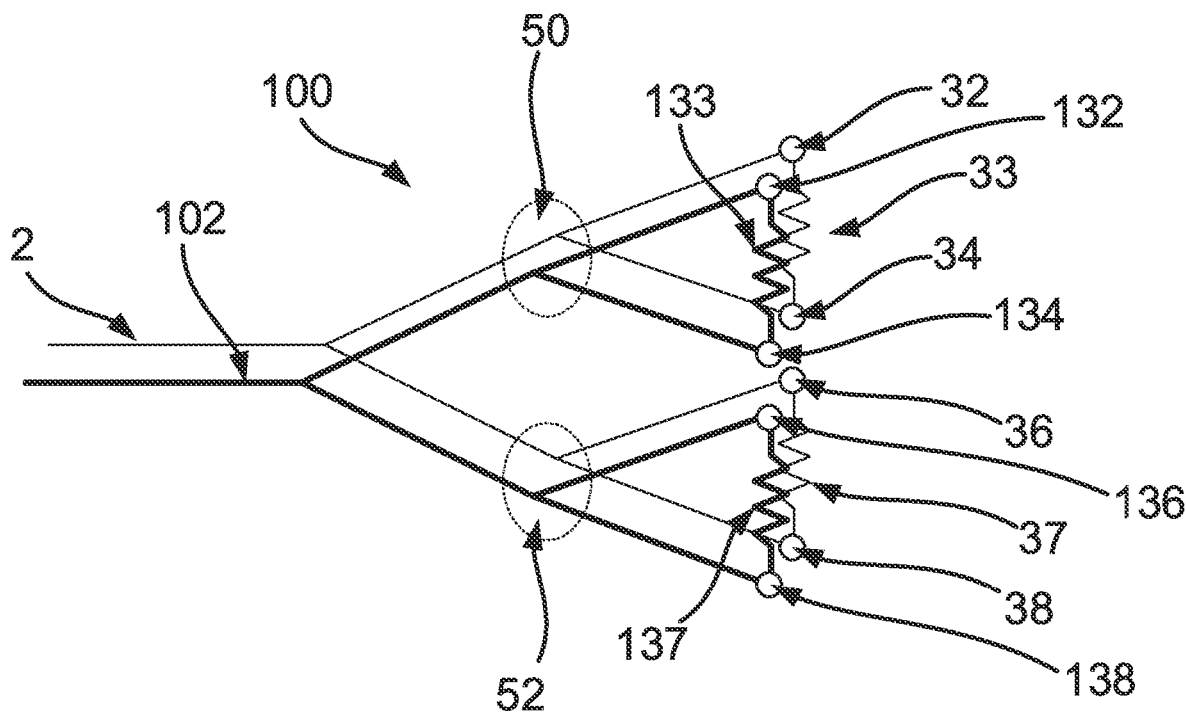
FIG. 4 schematically illustrates a power combiner/splitter according to another embodiment of this disclosure.

FIG. 4 schematically illustrates a power combiner/splitter 100 according to another embodiment of this disclosure. As with the embodiment of FIG. 3, the power combiner/splitter 100 in this embodiment comprises a first combiner/splitter which overlays the second combiner/splitter. However, in this embodiment, both combiner/splitters in the power combiner/splitter 100 have the same orientation so that the port 2 of the first combiner/splitter is provided on the same side of the power combiner/splitter 100 as the port 102 of the second combiner/splitter and such that the ports 132, 134, 136, 138 of the second combiner/splitter are provided on the same side of the power combiner/splitter 100 as the ports 32, 34, 36, 38 of the first combiner/splitter.

The combiner/splitters in FIGS. 3 and 4 may include further cascading of the kind noted above in relation to FIG. 2, thereby to increase the number of ports.

When combiner/splitters are overlaid in the manner shown in FIG. 3 or 4, isolation between the paths of the combiner/splitters may become problematic. For instance, cross talk may occur at points such as the points 50, 52 shown in FIGS. 3 and 4, where branching points of the paths within each combiner/splitter overlap.

In accordance with embodiments of this disclosure, the features of a power combiner/splitter may be incorporated in a metallisation stack. The design flexibility afforded by implementing the power combiner/splitter in a metallisation stack may allow for easy scaling (cascading) of the combiner/splitters and may also allow for steps to be taken to improve isolation between the various paths of overlying combiner/splitters.

A power combiner/splitter 100 according to a further embodiment of this disclosure will now be described with reference to FIGS. 5 to 10.

Figure 5:
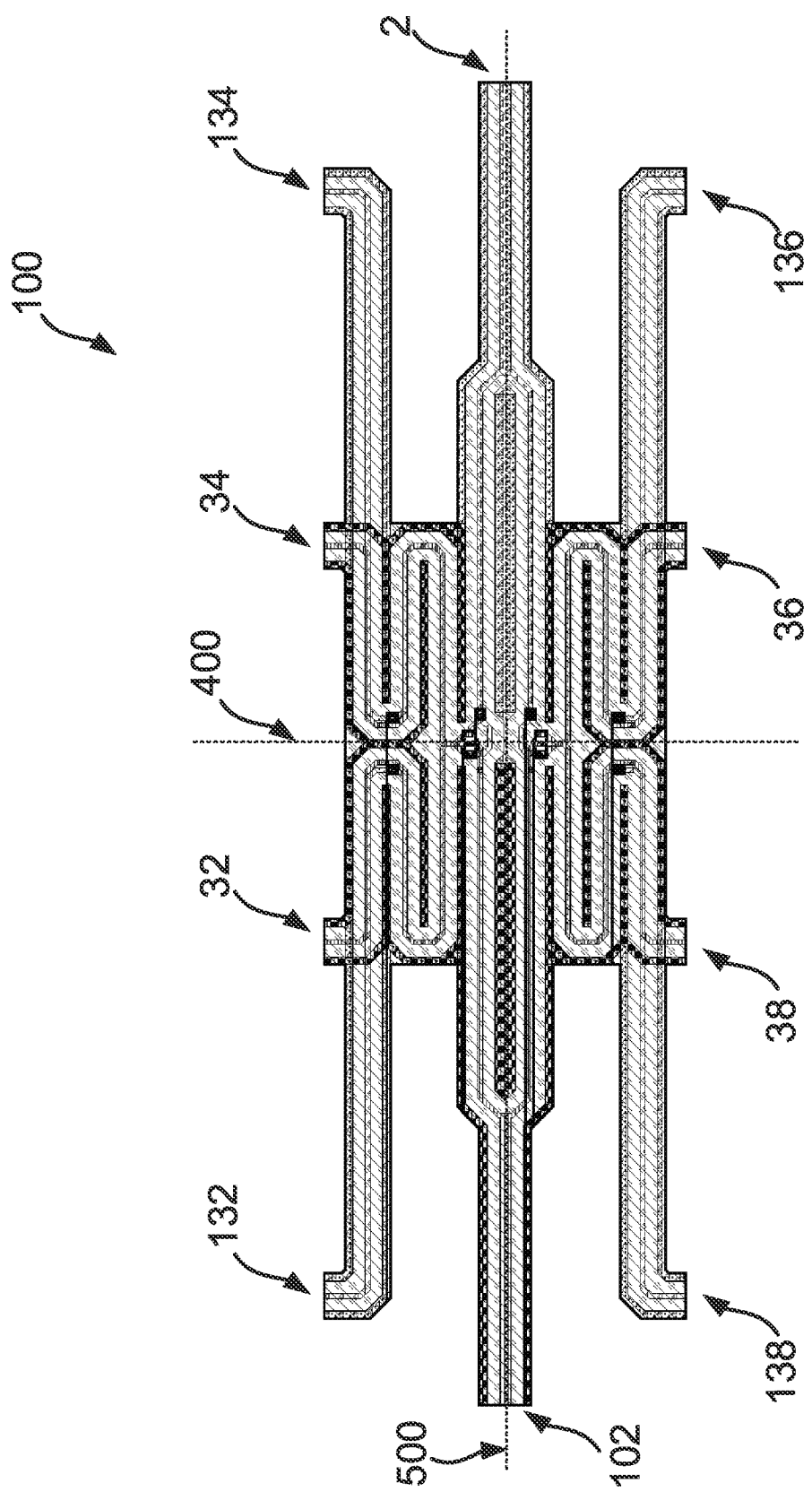
FIG. 5 shows a power combiner/splitter according to a further embodiment of this disclosure.

An overview of the power combiner/splitter 100 is shown in FIG. 5. The power combiner/splitter 100 in this embodiment has a first combiner/splitter having ports 2, 32, 34, 36, 38 and a second combiner/splitter having ports 102, 132, 134, 136, 138, and the internal paths of the first and second combiner/splitters may be topologically similar to those described in relation to FIGS. 3 and 4. The overall topology of the power combiner/splitter 100 in FIG. 5 is similar to that shown in FIG. 3 in the sense that the ports 2, 102 located on opposite sides of the power combiner/splitter 100, however embodiments having topologies similar to that shown in FIG. 4 may be implemented, in which the ports 2, 102 are located on the same side of the power combiner/splitter 100. Note that the ports 32, 34 and the ports 132, 134 are provided one the same side of the power combiner/splitter 100 in FIG. 5, as are the ports 36, 38 and the ports 136, 138.

As described herein, the features (paths/ports) of the power combiner/splitter 100 in FIG. 5 are implemented using a plurality of metal layers in a metallisation stack. Each metal layer in the stack includes patterned metal features defining the paths, ports, etc. of the first and second combiner/splitters. Dielectric layers may be provided in between the layers and vias may extend through the dielectric layers so as to interconnect patterned metal features in the different metal layers. Dielectric may also be present within the "metal" layers, to fill the areas not occupied by the patterned metal features. As will be described below in relation to FIG. 11, the metallisation stack may be located on a surface such as the surface of a semiconductor substrate or other carrier (e.g. a printed circuit board (PCB)).

Figure 6:
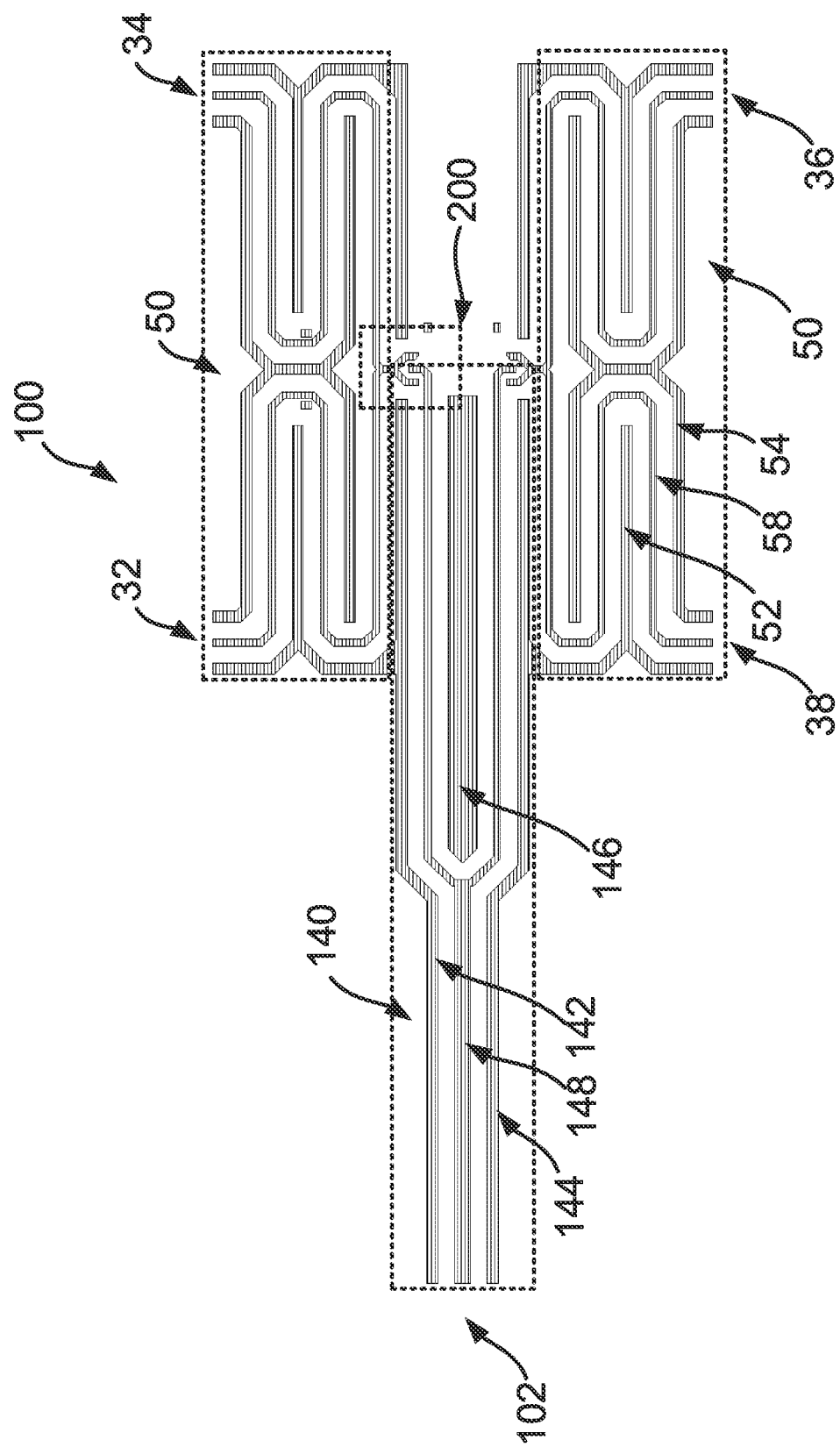
FIG. 6 shows a lower layer of the power combiner/splitter of FIG. 5.

FIG. 6 shows a first layer of the power combiner/splitter of FIG. 5. In this embodiment, the first layer is a "lower" layer, but the arrangement may be inverted such that the layer shown in FIG. 6 is an "upper" layer.

The layer in FIG. 6 includes patterned metal features of the branched arrangements form the paths of both the first and the second combiner/splitters of the power combiner/splitter 100. In particular, a first stage 140 of the second combiner/splitter is present, as is the second stage 50 of the first combiner/splitter. Each stage 140, 50 includes patterned metal features defined in the lower layer of the metallisation stack.

In particular, in this embodiment, the first stage 140 of the second combiner/splitter includes a signal line 148 and two ground lines 142, 144 which are arranged on either side of the signal line 148. Note that the signal line bifurcates, and each bifurcated path leads onto respective parts of the second stage 150 of the second combiner/splitter (see FIG. 8). A further ground line 146 is positioned between the two bifurcated paths of the signal line 148. The ground lines 142, 144, 146 collectively act to improve the isolation of the signal line 148, to inhibit cross talk with other features in the stack, such as the patterned metal features forming the first combiner/splitter.

The second stage 50 of the first combiner/splitter in this embodiment has two parts provided on opposite sides of the power combiner/splitter 100. Each part may be arranged as a mirror image of the other part, as shown in FIG. 6. Each part includes a signal line 58. Note that the signal line 58 in each part of the second stage 50 is bifurcated, with one path of the bifurcated signal line leading to/from the port 36 (or the port 32) and the other leading to/from the port 38 (or the port 34). Each part of the second stage also includes ground lines 52, 54. The ground lines 52, 54 are located on either side of the signal line 58, to improve the isolation of the signal line 58. Note that in the present embodiment the ground line 52 may be coupled to the ground line 144.

The area 200 includes features for coupling the various patterned metal features of the lower layer of the stack with features in other layers of the stack. These features with be described below in relation to FIGS. 9 and 10.

Figure 7:
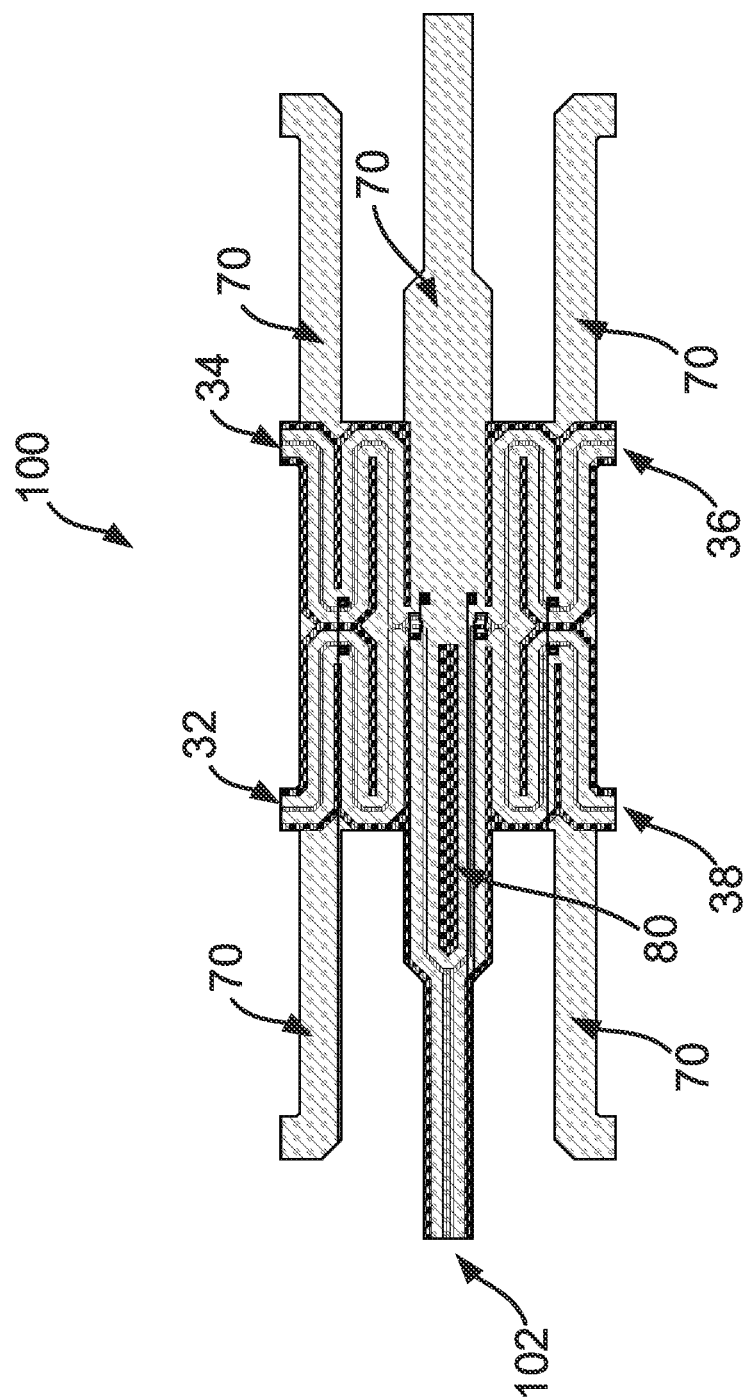
FIG. 7 shows an intermediate layer of the power combiner/splitter of FIG. 5.

FIG. 7 shows an intermediate layer of the power combiner/splitter of FIG. 5. The intermediate layer is located in between the first layer shown in FIG. 6 and the further layer to be described below in relation to FIG. 8. The underlying features of the lower layer described above in relation to FIG. 6 may also be seen in FIG. 7.

The intermediate layer in this embodiment includes patterned metal features forming a ground plane 70. The ground plane 70 is thus located in between the patterned metal features in the lower layer and the upper lay of the stack, thereby to improve the isolation between the first and second combiner/splitters. The ground plane 70 thereby forms a shared ground plane for the branched arrangements of the first and second combiner/splitters. The ground plane 70 in this embodiment extends to substantially cover the area (or "footprint") occupied by the features of the lower layer and the upper layer of the stack, again to improve the isolation between the first and second combiner/splitters.

In this embodiment, a via 80 extends though the stack to connect the ground line(s) (e.g. the ground line 146) to the ground plane 70. Other such vias may also be provided to connect the ground plane 70 to the other ground lines 142, 144, 52, 54 in the lower layer, as well as to the ground lines in the upper layer.

Figure 8:
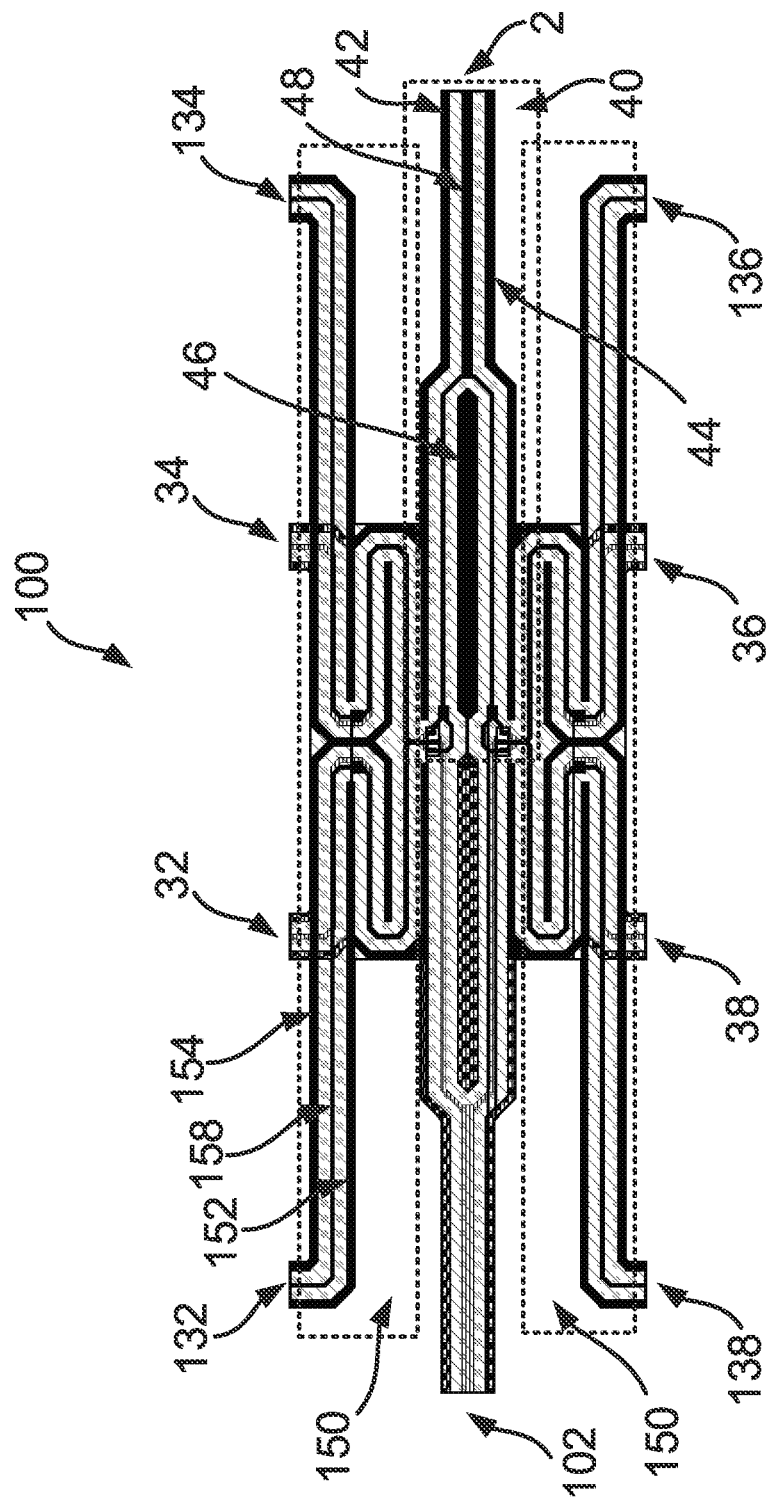
FIG. 8 shows an upper layer of the power combiner/splitter of FIG. 5.

FIG. 8 shows a further layer of the power combiner/splitter of FIG. 5. In this embodiment, the further layer is an "upper" layer in the stack. However, as noted above, the layers in the stack may be inverted such that the layer shown in FIG. 8 is a "lower" layer. The underlying features of the lower layer described above in relation to FIG. 6 and the intermediate layer described above in relation to FIG. 7 may also be seen in FIG. 8.

The layer in FIG. 8 includes patterned metal features of the branched arrangements form the paths of both the first and the second combiner/splitters of the power combiner/splitter 100. In particular, a second stage 150 of the second combiner/splitter is present, as is the first stage 40 of the first combiner/splitter. Each stage 40, 150 includes patterned metal features defined in the upper layer of the metallisation stack.

As will be appreciated from the description below, the patterned metal features of the second stage 150 of the second combiner/splitter and the first stage 40 of the first combiner/splitter in the upper layer may be similar is some respects to the patterned metal features of the first stage 140 of the second combiner/splitter and the second stage 50 of the first combiner/splitter described above in relation to FIG. 6. Note that in this embodiment however, the ports 132, 134 are laterally separated from the ports 32, 34 so that they do not overlay each other in the stack (the ports 136, 138 and the ports 36, 38 are arranged similarly), thereby improving the isolation between the various ports.

In this embodiment, the first stage 40 of the first combiner/splitter includes a signal line 48 and two ground lines 42, 44 which are arranged on either side of the signal line 48. Note that the signal line bifurcates, and each bifurcated path leads onto respective parts of the second stage 50 of the first combiner/splitter (see FIG. 6). A further ground line 46 may be positioned between the two bifurcated paths of the signal line 48. The ground lines 42, 44, 46 collectively act to improve the isolation of the signal line 48, to inhibit cross talk with other features in the stack, such as the patterned metal features forming the second combiner/splitter.

The second stage 150 of the second combiner/splitter in this embodiment has two parts provided on opposite sides of the power combiner/splitter 100. These opposite sides may correspond to the sides of the power combiner/splitter 100 in which the two parts of the second stage 50 of the first combiner/splitter are located. The two parts of each second stage 50, 150 in the stack may therefore overlap to some extent. As described above, the ground plane 70 may be located in between these parts, so as to improve the isolation between them.

Each part of the second stage 150 may be arranged as a mirror image of the other part, as shown in FIG. 8. Each part includes a signal line 158. Note that the signal line 158 in each part of the second stage 150 is bifurcated, with one path of the bifurcated signal line leading to/from the port 136 (or the port 132) and the other leading to/from the port 138 (or the port 134). Each part of the second stage 150 also includes ground lines 152, 154. The ground lines 152, 154 are located on either side of the signal line 158, to improve the isolation of the signal line 158. Note that in the present embodiment the ground line 152 may be coupled to the ground line 42.

Figure 9:
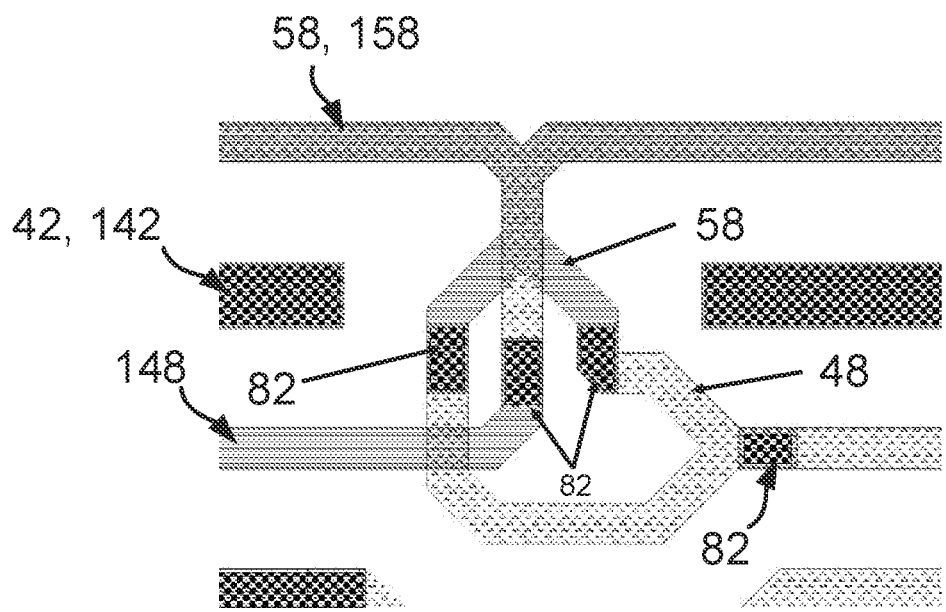
FIGS. 9 and 10 show a detail of the power combiner/splitter of FIG. 5.
Figure 10:
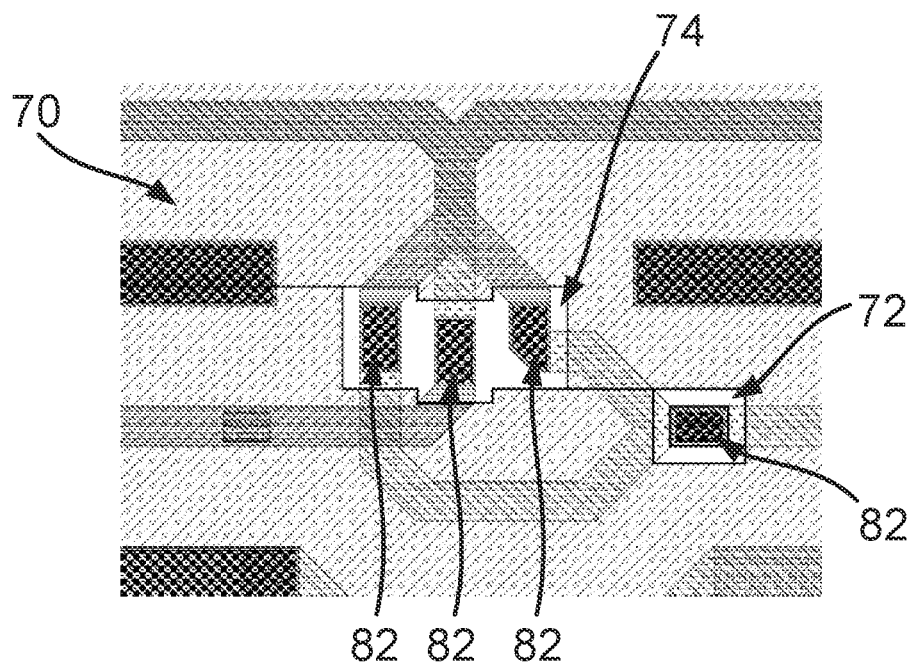

FIGS. 9 and 10 show a detail of the power combiner/splitter, corresponding to the area 200 shown in FIG. 6. In particular, while patterned metal features of the upper and lower layers can be seen in FIG. 9, FIG. 10 shows the same arrangement with the inclusion of the ground plane 70. Note also that the layout shown in FIG. 6 has another area neighboring to the area 200, which may have a similar layout mirror image of) the layout shown in FIG. 9.

The area 200 in FIG. 9 includes an end of the signal line 148 of the first stage 140 of the second combiner/splitter and its connection through the stack to the signal line 158 of the second stage 150 of the second combiner/splitter by a via 82, which extends vertically through the stack between the lower layer and the upper layer.

The area 200 in FIG. 9 also includes an end of the signal line 48 of the first stage 40 of the first combiner/splitter and its connection through the stack to the signal line 58 of the second stage 50 of the first combiner/splitter by a pair of vias 82, which again extend vertically through the stack between the lower layer and the upper layer.

Note that the parts of the signal lines 58, 158 shown in FIG. 9 overlap and there are also a number of cross over points between the lines of the upper and lower layers shown in FIG. 9. Again, the ground plane 70 described herein may serve to improve the isolation of these parts of the combiner/splitters at those points.

As can be seen in FIG. 10, the ground plane 70 may be provided with openings 72, 74 to allow one or more of the vias 82 to extend between the upper and lower layers of the stack, so as to interconnect the patterned metal features in those layers with each other without shorting at the ground plane 70. The openings 74 may generally conform with the footprint of one (e.g. at 72) or a collection (e.g. at 74) of vias 82. This can allow the openings 72, 74 to be made relatively small for improving the isolation provided by the ground plane 70 at the interface between the first and second stage of each combiner/splitter.

Figure 11:
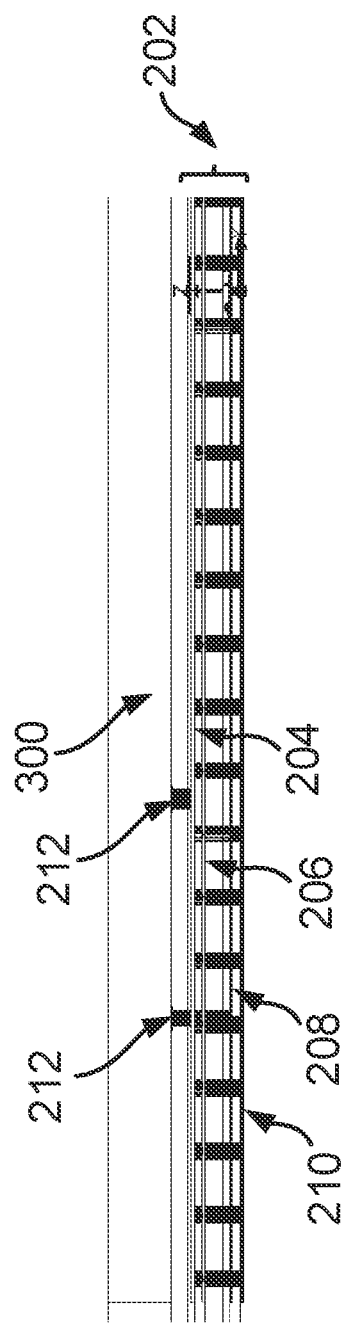
FIG. 11 shows a power combiner/splitter provided on a semiconductor substate according to an embodiment of this disclosure.

FIG. 11 shows a power combiner/splitter 100 of the kind described above provided on a surface of a semiconductor substate 300 according to an embodiment of this disclosure. The substrate 300 be a semiconductor die of an integrated circuit. As described previously, the metallisation stack 202 implementing the power combiner/splitter 100 may be provided on some other kind of surface, such as the surface of a printed circuit board (PCB). In FIG. 11, the metallisation stack has four layers 204, 206, 208, 210. These layers 204, 206, 208, 210 may for instance correspond to layers Cu1, Cu2, Cu3, Cu4 in a metallisation stack. As noted previously, dielectric layers may be provided in between the layers 204, 206, 208, 210 and vias may extend through the dielectric layers so as to interconnect patterned metal features in the different metal layers 204, 206, 208, 210. Again, dielectric may also be present within the "metal" layers, to fill the areas not occupied by the patterned metal features.

To provide electrical connections between the stack 202 and the substrate 300, metal (e.g. Cu) posts 212 may extend from the stack 202 toward the substrate 300. These posts 212 may, for instance, be connected to the various ports of the combiner/splitters located in the stack 202.

According to embodiments of this disclosure, a method of making a power combiner/splitter of the kind described above may be provided. Standard back-end-of-line processing techniques may be used to form the metallisation stack and the various features of the combiner/splitters.

The method may include forming a metallisation stack formed on a surface (e.g. that of the substrate 300 shown in FIG. 11. The metallisation stack may include a plurality of layers including patterned metal features (e.g. as described above in relation to FIGS. 5 to 10).

The patterned metal features may form a first branched arrangement (e.g. see the stages 40, 50 described above in relation to FIGS. 6 and 8) having a first port located at one end of the first branched arrangement. The first branched arrangement may also have a plurality of further ports located at another end of the first branched arrangement. The first branched arrangement may further include a plurality of bifurcated branches extending between each end of the first branched arrangement for dividing/combining a signal passing through the first branched arrangement between the first port and the plurality of further ports of the first branched arrangement.

The patterned metal features may also form a second branched arrangement (e.g. see the stages 140, 150 described above in relation to FIGS. 6 and 8). The second branched arrangement may have a first port located at one end of the second branched arrangement. The second branched arrangement may also have a plurality of further ports located at another end of the second branched arrangement. The first branched arrangement may further include a plurality of bifurcated branches extending between each end of the second branched arrangement for dividing/combining a signal passing through the second branched arrangement between the first port and the plurality of further ports of the second branched arrangement.

The first branched arrangement and the second branched arrangement may be located in a common area of the metallisation stack such that at least some of the patterned metal features forming the first branched arrangement overlie at least some of the patterned metal features forming the second branched arrangement.

The method may further include forming a common ground plane in a layer of the metallisation stack (e.g. as described above in relation to FIG. 7. The common ground plane may be shared by the first and second branched arrangements.

A review of FIGS. 5 to 9 shows that the layout of the power combiner/splitter 100 may in some embodiments have at least one plane of symmetry. This can improve the operation of the power combiner/splitter 100 by reducing phase imbalance and phase insertion between the different paths in the power combiner/splitter 100. For instance, in the embodiment of FIGS. 5 to 9, the power combiner/splitter 100 has two planes of symmetry 400, 500, which are orthogonal to each other as shown in FIG. 5.

Accordingly, there has been described a power combiner/splitter for multiple input multiple output (MIMO) applications and a method of making the same. A metallisation stack has a plurality of layers including patterned metal features forming first and second branched arrangements of the power combiner/splitter. Each branched arrangement includes a port located at one end of that branched arrangement, and a plurality of further ports. Each branched arrangement also includes a plurality of bifurcated branches extending between each end of that branched arrangement for dividing/combining a signal passing through that branched arrangement between the port and the plurality of further ports. The metallisation stack further includes a common ground plane that is shared by the first and second branched arrangements. At least some of the patterned metal features forming the first branched arrangement overlie at least some of the patterned metal features forming the second branched arrangement.

Although particular embodiments of this disclosure have been described, it will be appreciated that many modifications/additions and/or substitutions may be made within the scope of the claims.

The invention claimed is:

1. A power combiner/splitter for multiple input multiple output (MIMO) applications, the power combiner/splitter comprising:
   a metallisation stack formed on a surface, the metallisation stack comprising a plurality of layers including patterned metal features, the patterned metal features forming:
   a first branched arrangement comprising:
      a first port located at one end of the first branched arrangement;
      a plurality of further ports;
      a plurality of bifurcated branches extending between the first port of the first branched arrangement and the plurality of further ports of the first branched arrangement for dividing/combining a signal passing through the first branched arrangement between the first port and the plurality of further ports of the first branched arrangement; and
   a second branched arrangement comprising:
      a first port located at one end of the second branched arrangement;
      a plurality of further ports;
      a plurality of bifurcated branches extending between the first port of the second branched arrangement and the plurality of further ports of the second branched arrangement for dividing/combining a signal passing through the second branched arrangement between the first port and the plurality of further ports of the second branched arrangement;
   wherein the metallisation stack further comprises a common ground plane shared by the first and second branched arrangements,
   wherein the first branched arrangement and the second branched arrangement are located in a common area of the metallisation stack such that at least some of the patterned metal features forming the first branched arrangement overlie at least some of the patterned metal features forming the second branched arrangement, and wherein the metallisation stack includes two layers each including patterned metal features forming at least some of the branches of the first branched arrangement and patterned metal features forming at least some of the branches of the second branched arrangement.

2. The power combiner/splitter of claim 1, wherein:
the first port of the first branched arrangement is an input and the plurality of further ports of the first branched arrangement are outputs; or
the first port of the first branched arrangement is an output and the plurality of further ports of the first branched arrangement are inputs.

3. The power combiner/splitter of claim 2, wherein:
the first port of the second branched arrangement is an input and the plurality of further ports of the second branched arrangement are outputs; or
the first port of the second branched arrangement is an output and the plurality of further ports of the second branched arrangement are inputs.

4. The power combiner/splitter of claim 2, wherein the first port of the first branched arrangement and the first port of the second branched arrangement are located at the same end of the power combiner/splitter.

5. The power combiner/splitter of claim 2, wherein the first port of the first branched arrangement and the first port of the second branched arrangement are located at opposite ends of the power combiner/splitter.

6. The power combiner/splitter of claim 1, wherein:
the first port of the second branched arrangement is an input and the plurality of further ports of the second branched arrangement are outputs; or
the first port of the second branched arrangement is an output and the plurality of further ports of the second branched arrangement are inputs.

7. The power combiner/splitter of claim 1, wherein the first port of the first branched arrangement and the first port of the second branched arrangement are located at the same end of the power combiner/splitter.

8. The power combiner/splitter of claim 1, wherein the first port of the first branched arrangement and the first port of the second branched arrangement are located at opposite ends of the power combiner/splitter.

9. The power combiner/splitter of claim 1, wherein:
a first of said two layers includes:
patterned metal features forming branches of the first branched arrangement proximal the first port of the first branched arrangement; and
patterned metal features forming branches of the second branched arrangement proximal said plurality of further ports of the second branched arrangement; and
a second of said two layers includes:
patterned metal features forming branches of the first branched arrangement proximal said plurality of further ports of the first branched arrangement; and
patterned metal features forming branches of the second branched arrangement proximal said first port of the second branched arrangement.

10. The power combiner/splitter of claim 1, wherein the ground plane is located in a layer located in-between said two layers.

11. An integrated circuit comprising the power combiner/splitter of claim 1, wherein the metallisation stack is formed on a surface of a semiconductor die of the integrated circuit.

12. A carrier for a semiconductor device, the carrier comprising the power combiner/splitter of claim 1, wherein the metallisation stack is formed on a surface of the carrier.

13. An integrated circuit comprising the power combiner/splitter of claim 1, wherein the metallisation stack is formed on a surface of a semiconductor die of the integrated circuit.

14. A method of making a power combiner/splitter for multiple input multiple output (MIMO) applications, the method comprising:
forming a metallisation stack formed on a surface, the metallisation stack comprising a plurality of layers including patterned metal features, the patterned metal features forming:
a first branched arrangement comprising:
a first port located at one end of the first branched arrangement;
a plurality of further ports;
a plurality of bifurcated branches extending between the first port of the first branched arrangement and the plurality of further ports of the first branched arrangement for dividing/combining a signal passing through the first branched arrangement between the first port and the plurality of further ports of the first branched arrangement; and
a second branched arrangement comprising:
a first port located at one end of the second branched arrangement;
a plurality of further ports;
a plurality of bifurcated branches extending between the first port of the second branched arrangement and the plurality of further ports of the second branched arrangement for dividing/combining a signal passing through the second branched arrangement between the first port and the plurality of further ports of the second branched arrangement;
wherein the first branched arrangement and the second branched arrangement are located in a common area of the metallisation stack such that at least some of the patterned metal features forming the first branched arrangement overlie at least some of the patterned metal features forming the second branched arrangement, and wherein the metallisation stack includes two layers each including patterned metal features forming at least some of the branches of the first branched arrangement and patterned metal features forming at least some of the branches of the second branched arrangement; and
forming a common ground plane in a layer of the metallisation stack, wherein the common ground plane is shared by the first and second branched arrangements.

* * * * *